United States Patent [19]

Jong

[11] Patent Number: 4,490,689
[45] Date of Patent: Dec. 25, 1984

[54] BALANCED MODULATOR USING LOGIC GATES FOR DSBSC OUTPUT

[75] Inventor: Kenneth Jong, Maplewood, N.J.

[73] Assignee: AT&T Bell Laboratories, Murray Hill, N.J.

[21] Appl. No.: 419,803

[22] Filed: Sep. 20, 1982

[51] Int. Cl.³ .............................................. H03C 1/54
[52] U.S. Cl. .............................. 332/31 T; 332/43 B; 332/44; 332/48; 332/51 R; 375/43; 375/61; 455/46; 455/109
[58] Field of Search ............... 332/44, 43 B, 31 T, 332/48, 51 R; 375/43, 61; 455/46, 109

[56] References Cited

U.S. PATENT DOCUMENTS

| | | | |
|---|---|---|---|
| 3,401,359 | 9/1968 | Becker | 332/16 |
| 3,636,478 | 1/1972 | Glock | 332/43 B |
| 4,142,162 | 2/1979 | Huntley | 332/31 T |
| 4,346,354 | 8/1982 | Hanna | 332/43 B |

*Primary Examiner*—Siegfried H. Grimm
*Assistant Examiner*—D. C. Mis
*Attorney, Agent, or Firm*—Joseph P. Kearns; Robert O. Nimtz

[57] ABSTRACT

A balanced modulator, producing a double sideband suppressed carrier (DSBSC) output achieves carrier suppression and linear performance suitable to modulate frequency division multiplexed signals with stringent interchannel interference requirements. It is simply and inexpensively realized through the use of two logic gates which are arranged in a dual complementary fashion, so that their output terminals go high and low alternately, and which drive a center-tapped transformer through coupling capacitors to provide the required switching function necessary to produce the DSBSC output. The modulator circuit has the added feature that the square wave carrier source that is applied to the logic gates can be the means of activating the circuit, thereby eliminating the need for a separate power supply.

8 Claims, 2 Drawing Figures

BALANCED MODULATOR USING LOGIC GATES FOR DSBSC OUTPUT

TECHNICAL FIELD

This invention relates to modulators and, in particular, to switching modulators which provide a double sideband suppressed carrier output.

BACKGOUND OF THE INVENTION

Modulators known to produce the double-sideband suppressed carrier (DSBSC) output by employing a switch-type of modulation include ring modulators, shunt modulators and series modulators. Each of these modulators utilizes diodes arranged in a bridge configuration. In shunt and series modulators the baseband, i.e., modulating, signal is alternately short circuited or open circuited at the carrier rate. This produces a sampled waveform resembling that of a pure product multiplier which realizes the DSBSC output. Shunt and series modulators have the disadvantage that the ideal switching function, assumed to be instantaneous in operation between zero and infinite impedances, cannot be achieved in practical circuits. The result is that changes in the carrier level affect the switching function and unwanted harmonics of the modulating and carrier frequencies are introduced into the output. Another disadvantage is that the diodes must be carefully matched to ensure maximum carrier suppression.

The ring modulator acts as a reversing switch to generate an output waveform similar to that of the shunt modulator but one whose switching function swings between positive and negative values. Unlike shunt and series modulators, ring modulators suppress the baseband component. Ring modulators also have the further advantage over the shunt modulators in that even harmonics of the carrier frequency are suppressed as well. Disadvantages associated with the ring modulator lie in the difficulty of matching diodes initially and of maintaining that match in the face of temperature fluctuations in individual diode characteristics. Balanced ring modulators additionally require expensive input and output transformers. These problems are further complicated in multichannel systems which have very stringent interchannel interference requirements.

it is an object of this invention to provide a self-powered balanced modulator with improved carrier suppression capability.

SUMMARY OF THE INVENTION

According to this invention, a balanced modulator for generating a DSBSC output signal is realized through the use of a pair of logic gates and a single center-tapped transformer. The logic gates, arranged in a dual complementary fashion, are driven by a carrier signal acting as a high speed switch. The transformer, capacitively coupled to the logic gates, is reversed in polarity at the carrier rate and thereby switches the modulating signal applied to its center tap at the carrier rate.

In an illustrative embodiment conventional exclusive-NOR (XNOR) integrated circuits fabricated on the same substrate provide the anti-coincidence logic-gate functions. External direct-current (d.c.) power requirements can be eliminated for the logic gates by the expedient of a storage capacitor shunting the normal input power terminals. A self-biasing feature is thus effected.

The modulator is useful in processing double-sideband suppressed carrier signal. By keeping spurious mixer lines and mixer noise low and by achieving good carrier isolation the stringent requirements of a multichannel, frequency-division multiplexed (FDM) system can be met.

DETAILED DESCRIPTION

Figure 1:
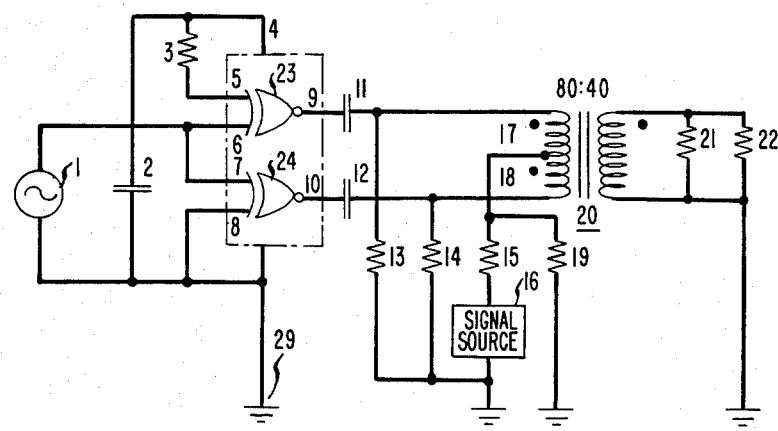
FIG. 1 is a simplified schematic diagram of the circuit representing a balanced modulator according to this invention.

FIG. 1 is a schematic diagram of the modulator circuit of this invention. Features of this modulator are its use of logic gates a single center-tapped transformer and a self-biasing power supply. The embodiment of the circuit shown in FIG. 1 comprises two exclusive-NOR (XNOR) gates 23 and 24; coupling capacitors 11 and 12; square wave carrier source 1; modulation signal source 16; center-tapped transformer 20; and shunt resistors 13, 14, 19 and 21.

In operation, the square wave carrier input to XNOR gates 23 and 24 causes the output terminals 9 and 10 to switch alternately between their high and low states. This, in turn, acts to switch the modulating signal from source 16 successively between the two primary windings 17 and 18 of the center-tapped transformer, thereby producing the desired DSBSC output. The modulator utilizes two of four gates 23 and 24 (the two remaining gates are not shown in FIG. 1) in the standard type of open collector XNOR integrated circuit (Schottky TTL type). XNOR gates 23 and 24 are arranged in the dual complementary output configuration, so that output terminals 9 and 10 go high and low alternately. TABLE I illustrates the operation of an XNOR gate.

TABLE I

| Inputs | | Output |
|---|---|---|
| 0 | 0 | 1 |
| 0 | 1 | 0 |
| 1 | 0 | 0 |
| 1 | 1 | 1 |

It is clear from TABLE I that the output is a high (1) only when the inputs are simultaneously either high or low (0).

Referring to FIG. 1, output terminal 9 of XNOR gate 23 is high when the input signal from carrier source 1 at terminal 6 is high. The other input terminal 5 is always fixed at the same high state by reason of its connecton to the power input pin 4 through resistor 3. Gate 24 exhibits a low output at terminal 10 when the carrier wave is high at input terminal 7 since its other input terminal 8 is tied to ground. The reverse situation applies when the square wave makes its low transition.

Replacing the four diodes used in conventional ring modulators with the two logic gates in realizing DSBSC modulation has the advantage that diode matching problems are substantially eliminated since both logic gates are fabricated on the same substrate. Using logic gates is also advantageous in producing a modulator that is simple, reliable and inexpensive.

The XNOR gate outputs at terminals 9 and 10 are linked to the center-tapped transformer 20 through coupling capacitors 11 and 12 which serve to block d.c. power from the logic gates. The d.c. blockage is necessary in order that the switch, created by an open-collector, connected internally, transistor in each of gates 23 and 24, operates properly. The open-collector transistor acts as an a.c. suppressed carrier switch in the absence of d.c. voltage at its collector. For high modulating signal levels, the unilateral characteristics of such a transistor are enhanced. For low modulating signal levels, however, the collector junction of the open-collector transistor will not be forward biased.

Connected via the coupling capacitors 11 and 12 is a center-tapped transformer 20 at which the modulating signal is applied. The modulating signal from source 16 is switched alternately between the two primary half windings 17 and 18 of transformer 20, thereby modulating the signal into two complementary components 180 degrees out of phase from each other. This DSBSC signal is produced across the transformer output winding at load 22. Shunt resistors 13 and 14 are placed across primary windings 17 and 18 as shown in order to damp the ringing effect caused by current switching in the transformer windings.

Center-tapped transformer 20 in FIG. 1 advantageously uses a Ferrox cube 1041 size toroid core. It has a 40-turn bifilar winding twisted with a 40-turn unbifilar winding (36 guage wire) to provide a 2:1 turns ratio transformer with a minimum interstitial capacitance. The requirement of minimum interstitial capacitance is necessary in order to provide a high switching bandwidth on half windings 17 and 18 of transformer 20. Approximately 1.2 mh of magnetizing inductance at 100 kHz is achieved in a typical embodiment through the use of 3e2A type ferrite material from Ferrox cube. This allows for a 75 ohm impedance operating level. Shunt resistors 19 and 21 across modulating source 16 and the output winding of transformer 20, respectively, maintain the desired input and output impedance levels. Their values are determined by measuring the conversion loss and impedance level for individual voltage levels and by calculating the resistance necessary to maintain the 75-ohm impedance requirement. Resistor 22 represents a utilization circuit such as, a transmission line or a receiver circuit.

Figure 2:
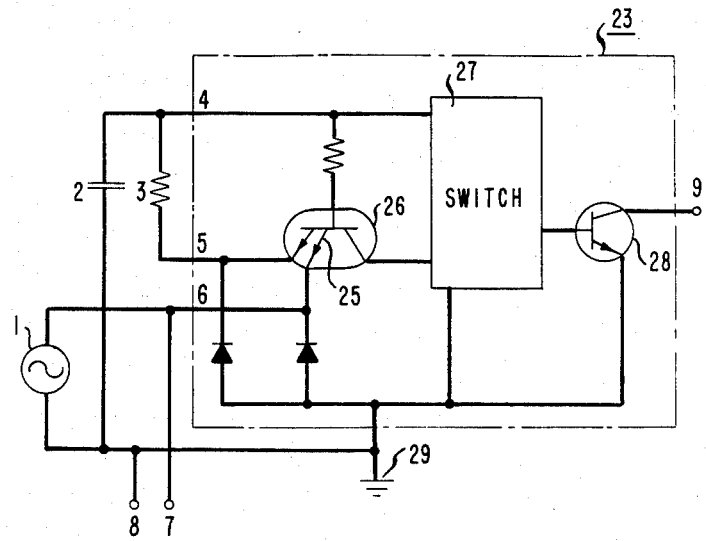
FIG. 2 is a simplified schematic diagram of the Western Electric type 41BN open collector quad exclusive-NOR gate useful in the practice of this invention.

Referring to FIG. 2 of the drawing, there is shown a simplified schematic diagram for one Western Electric type 41BN XNOR logic gate found on chip 23 of FIG. 1. A separate five-volt d.c. power supply can be used to power the chip across terminals 4 and 29 or, as shown in FIG. 2, chip 23 can be activated through a self-biased power supply. The self-biasing capabilities become evident from examining the two cases presented when the square wave carrier makes its low-to-high and high-to-low transitions. In the first case the positive transition from low to high produces maximum reverse current (approximately 0.4 ma) at emitter junction 25 of npn transistor 26. This current creates enough power to activate all the remaining stages in the XNOR chip contained in block 27 and to charge up capacitor 2. Input pin 5 floats high as a result of leakage current at emitter 25 also. The collector junction of transistor 26 is turned on in the active region when there are high inputs at both of input terminals 5 and 6. Turning transistors 26 on causes in turn the activation of switch 27, which consequently turns off transistor 28 and yields a high output at the collector 9. Transistor 28 is open at its collector and is protected from d.c. bias by capacitor 11 shown in FIG. 1.

When the square wave carrier makes its high to low transistion a second case arises. In this case the XNOR chip is no longer powered by the reverse current at emitter 25. Instead, capacitor 2 maintains power by discharging current into power input pin 4. Enough current is discharged to activate the XNOR chip as well as to retain the high status of emitter terminal 5. Thus, the signals at terminals 5 and 6 are held high and low, respectively, and the collector junction of transistor 26 is correspondingly turned off. In turn, switch 27 is not activated and output 9 goes low. Through the just-described mechanism, power is retained in the XNOR chip of FIG. 2 throughout the cycling of the square wave by the charging and discharging of the capacitor 2. The average charge level on capacitor 2 is sufficient to provide d.c. bias current to operate switch 26 as long as carrier wave source 1 in FIG. 1 is available.

Actual values for the circuit elements in a practical embodiment of the modulator of FIG. 1 are listed below in TABLE II.

TABLE II

| Element No. | Value |
|---|---|
| 1 | 8 volts p-p |
| 2 | 1 microfarad |
| 3 | 10 K ohm |
| 11 | 1 microfarad |
| 12 | 1 microfarad |
| 13 | 5K ohm |
| 14 | 5K ohm |
| 15 | 75 ohm |
| 16 | modulation signal source |
| 19 | 620 ohm |
| 21 | 620 ohm |
| 22 | 75 ohm |

The preferred embodiment of the invention utilizes an eight volt p-p carrier drive level. When the carrier frequency is set at 1 mHz, a conversion loss of 6.65 db expected as well as 77 db of carrier power balance. A 115 db reduction on the third order intermodulation production reference to the $-55$ dbm (milliwatt reference) sideband level is also achieved. This substantially meets a reduction requirement on the third order product of the modulating signal on the carrier which exists in a multichannel application.

Although the modulator circuit of the invention has been described in terms of the above specific circuit elements and materials, it is to be understood that additional modifications will readily occur to those skilled in the art within the spirit and scope of the appended claims.

What is claimed is:

1. A balanced modulator comprising:
    a carrier wave source;
    a modulating wave source;
    a pair of anti-coincidence gates each having first and second input terminals and a single output terminal, the first input terminal of each gate being fixedly biased either by a high voltage supply or a low voltage supply
    means for connecting said carrier wave source between the second input terminals of said pair of gates and one of said first input terminals;
    an output transformer having a center-tapped primary winding and a secondary winding;
    a utilization circuit connected across the secondary winding of said output transformer;

a pair of capacitors coupling the single output terminals of said pair of gates to the primary winding of said output transformer; and means for connecting said modulating wave source to the center tap of the primary winding of said output transformer.

2. The balanced modulator set forth in claim 1 in which each of said pair of gates is an exclusive-NOR gate in which like inputs produce a binary output of one and unlike inputs produce a binary output of zero.

3. The balanced modulator set forth in claim 1 in which said pair of gates is of the exclusive-NOR type fabricated on a common substrate.

4. The balanced modulator set forth in claim 1 in which the bias for the first input terminals of said pair of gates is provided from an external direct-current power source.

5. The balanced modulator set forth in claim 1 in which the bias for the first input terminals of said pair of gates is provided by leakage current from the carrier wave source driving the second input terminals of said pair of gates, and a further capacitor is connected in circuit with said pair of gates for developing and storing the voltage constituting said bias.

6. The balanced modulator set forth in claim 1 in which resistors are connected in shunt with each half section of the primary winding of said output transformer to damp ringing currents therein.

7. A balanced modulator including a carrier wave source, a center-tapped output transformer and a modulating wave source for modulating the output from said carrier wave source and delivery to said transformer characterized in that said carrier wave source drives the primary winding of the output transformer through a pair of anti-coincidence gates connected in dual complementary fashion in series with a pair of direct-current isolating capacitors, and a direct-current bias for operation of the pair of anti-coincidence gates, generated across an external capacitor, is derived from leakage current from the carrier wave source.

8. A balanced modulator including a carrier wave source, a center-tapped output transformer and a modulating wave source for modulating the output from said carrier wave source and delivery to said transformer characterized in that said carrier wave source drives the primary windings of said output transformer through a pair of anti-coincidence gates connected in dual complementary fashion in series with a pair of direct-current isolating capacitors and said modulating wave source is connected between the center tap of said transformer and a ground reference point.

* * * * *

UNITED STATES PATENT AND TRADEMARK OFFICE
CERTIFICATE OF CORRECTION

PATENT NO. : 4,490,689

DATED : December 25, 1984

INVENTOR(S) : K. Jong

It is certified that error appears in the above-identified patent and that said Letters Patent is hereby corrected as shown below:

Please insert the following immediately after the title:

--The Government has rights in this invention pursuant to Contract No. N00039-81-C-0316 awarded by the United States Navy.--.

Signed and Sealed this

Eighteenth Day of June 1985

[SEAL]

Attest:

DONALD J. QUIGG

Attesting Officer

Acting Commissioner of Patents and Trademarks